US010916178B2

(12) United States Patent
Bai et al.

(10) Patent No.: US 10,916,178 B2
(45) Date of Patent: Feb. 9, 2021

(54) GATE DRIVER ON ARRAY CIRCUIT AND DRIVING METHOD THEREOF, AND DISPLAY DEVICE

(71) Applicants: BOE TECHNOLOGY GROUP CO., LTD., Beijing (CN); CHONGQING BOE OPTOELECTRONICS TECHNOLOGY CO., LTD., Chongqing (CN)

(72) Inventors: Yajie Bai, Beijing (CN); Zhuo Xu, Beijing (CN); Yuanbo Zhang, Beijing (CN); Yan Fang, Beijing (CN); Ming Deng, Beijing (CN); Zijie Tang, Beijing (CN); Jaikwang Kim, Beijing (CN)

(73) Assignees: BOE TECHNOLOGY GROUP CO., LTD., Beijing (CN); CHONGQING BOE OPTOELECTRONICS TECHNOLOGY CO. LTD., Chongqing (CN)

( * ) Notice: Subject to any disclaimer, the term of this patent is extended or adjusted under 35 U.S.C. 154(b) by 374 days.

(21) Appl. No.: 15/774,442

(22) PCT Filed: Oct. 19, 2017

(86) PCT No.: PCT/CN2017/106921
§ 371 (c)(1),
(2) Date: May 8, 2018

(87) PCT Pub. No.: WO2018/188300
PCT Pub. Date: Oct. 18, 2018

(65) Prior Publication Data
US 2020/0286420 A1 Sep. 10, 2020

(30) Foreign Application Priority Data
Apr. 12, 2017 (CN) .......................... 2017 1 0237590

(51) Int. Cl.
*G09G 3/20* (2006.01)
*G11C 11/28* (2006.01)
*G11C 19/28* (2006.01)

(52) U.S. Cl.
CPC ........... *G09G 3/2092* (2013.01); *G11C 19/28* (2013.01); *G09G 2310/0286* (2013.01)

(58) Field of Classification Search
CPC ......... G09G 3/2092; G09G 2310/0286; G11C 19/00; G11C 19/28
See application file for complete search history.

(56) References Cited

U.S. PATENT DOCUMENTS 8,508,458 B2 * 8/2013 Han ..................... G09G 3/3677
345/100
10,168,977 B2 * 1/2019 Dun ....................... G11C 19/28
(Continued)

FOREIGN PATENT DOCUMENTS

CN 1727972 A 2/2006
CN 101197103 A 6/2008
(Continued)

OTHER PUBLICATIONS

International Search Report and Written Opinion dated Jan. 19; 2018; PCT/CN2017/106921.
(Continued)

*Primary Examiner* — Sardis F Azongha (57) ABSTRACT

A Gate Driver on Array circuit and a driving method thereof, and a display device. The Gate Driver on Array circuit includes at least one group of shift registers, each group of shift registers includes a plurality of shift registers in cascade, the plurality of shift registers including a first shift register, a second shift register connected after the first shift register, and a third shift register connected after the second shift register, wherein the third shift register is provided with
(Continued)

an initializing terminal connected to an output terminal of the first shift register.

11 Claims, 9 Drawing Sheets

(56) References Cited

U.S. PATENT DOCUMENTS

| | | |
|---|---|---|
| 2006/0022201 A1 | 2/2006 | Kim et al. |
| 2006/0221041 A1* | 10/2006 | Cho .................. G09G 3/20 345/100 |
| 2008/0136799 A1 | 6/2008 | Nakamura |
| 2011/0033022 A1* | 2/2011 | Zebedee ............ H03K 3/3562 377/81 |
| 2011/0150169 A1 | 6/2011 | Lin et al. |
| 2011/0156997 A1 | 6/2011 | Han et al. |
| 2015/0213762 A1 | 7/2015 | Xia et al. |
| 2017/0193945 A1* | 7/2017 | Feng .................. G09G 3/3677 |
| 2017/0316751 A1 | 11/2017 | Wang |

FOREIGN PATENT DOCUMENTS

| | | |
|---|---|---|
| CN | 102110420 A | 6/2011 |
| CN | 103943054 A | 7/2014 |
| CN | 104732907 A | 6/2015 |
| CN | 106935179 A | 7/2017 |
| WO | 2015/170700 A1 | 11/2015 |

OTHER PUBLICATIONS

The First Chinese Office Action dated Mar. 11, 2019, Appln. No. 201710237590.3.

* cited by examiner

GATE DRIVER ON ARRAY CIRCUIT AND DRIVING METHOD THEREOF, AND DISPLAY DEVICE

CROSS-REFERENCE TO RELATED APPLICATIONS

The present application claims priority of the Chinese Patent Application No. 201710237590.3 entitled "GATE DRIVER ON ARRAY CIRCUIT AND DRIVING METHOD THEREOF, AND DISPLAY DEVICE" filed on Apr. 12, 2017, the entire disclosure of which is hereby incorporated herein by reference.

TECHNICAL FIELD

The present disclosure relates to a Gate Driver on Array circuit and a driving method thereof, and a display device.

BACKGROUND

The Gate Driver on Array (GOA) technique integrates a gate driving circuit inside a display panel through manufacturing process of thin film transistors, so as to reduce cost of the gate driving circuit in the panel. Due to not requiring for bonding of gate driving circuits, the GOA technique can also increase productivity of the MDL process and realize a slim bezel design of the display panel.

SUMMARY

An aspect of the present disclosure relates to a Gate Driver on Array circuit, comprising at least one group of shift registers, each group of shift registers including a plurality of shift registers in cascade, the plurality of shift registers including a first shift register, a second shift register connected after the first shift register, and a third shift register connected after the second shift register, wherein the third shift register is provided with an initializing terminal, and the initializing terminal is connected to an output terminal of the first shift register.

In an embodiment, an input terminal of the third shift register may be connected to an output terminal of the second shift register, and an input terminal of the second shift register may be connected to the output terminal of the first shift register.

In an embodiment, a unidirectional conducting element may be disposed between the first shift register and the third shift register. An input terminal of the unidirectional conducting element may act as the initializing terminal of the third shift register, and an output terminal of the unidirectional conducting element may be connected to a reset terminal of the third shift register.

In an embodiment, the unidirectional conducting element may comprise: a first transistor, a source and a gate of the first transistor connected together serving as the input terminal of the unidirectional conducting element, and a drain of the third transistor serving as the output terminal of the unidirectional conducting element.

In an embodiment, in a case where the third shift register is provided with a total reset terminal, the total reset terminal may be used as the initializing terminal. In an embodiment, the third shift register may comprise: an initializing sub-circuit that receives an initializing signal via the initializing terminal of the third shift register, and resets a potential at a pull-up node inside the third shift register according to the received initializing signal.

In an embodiment, the initializing sub-circuit in the third shift register may comprise: a first transistor. A source and a gate of the first transistor may be connected together and connected to the initializing terminal of the third shift register, and a drain of the first transistor may be connected to a reset terminal of the third shift register. Also, a gate of the first transistor may be connected to the initializing terminal of the third shill register, a source of the first transistor may be connected to the pull-up node of the third shift register, and a potential at a drain of the first transistor may be set to a reset potential.

In an embodiment, the initializing sub-circuit in the third shift register may comprise: a second transistor. A gate of the second transistor may be connected to the drain of the first transistor, a source of the second transistor may be connected to an output terminal of the third shift register, and a potential at a drain of the second transistor may be set to a reset potential. Also, a gate of the second transistor may be connected to the initializing terminal of the third shift register, a source of the second transistor may be connected to an output terminal of the third shift register, and a potential at a drain of the second transistor may be set to a reset potential.

In an embodiment, the third shift register may further comprise: an input sub-circuit that receives an input signal via an input terminal of the third shift register, and controls a potential at the pull-up node according to the received input signal.

In an embodiment, the third shift register may further comprise: an output sub-circuit that receives a clock signal via a clock signal terminal of the third shift register, and controls an output terminal of the third shift register to output the received clock signal according to the potential at the pull-up node.

In an embodiment, the third shift register may further comprise: a reset sub-circuit that receives a reset signal via a reset terminal of the third shift register, and resets potentials at the pull-up node and the output terminal of the third shift register according to the received reset signal.

In an embodiment, the number of the at least one group of shift registers may be set to be half of the number of external clock signals received by the Gate Driver on Array circuit.

Another aspect of the present disclosure relates to a display device, comprising any one of the Gate Driver on Array circuits described above.

Another aspect of the present disclosure relates to a method for driving any one of the Gate Driver on Array circuits described above, wherein for each first shift register, the method comprises: providing an input signal to an input terminal of the first shift register, so that a potential at a pull-up node inside the first shift register becomes an operating potential; after the input signal is provided to the first shift register, outputting a gate driving signal at an output terminal of the first shift register, meanwhile providing the outputted gate driving signal as an initializing signal to an initializing terminal of the third shift register, so as to reset a potential at a pull-up node inside the third shift register; and after the gate driving signal is outputted from the first shift register, providing a gate driving signal outputted by the second shift register to a reset terminal of the first shift register, so as to reset a potential at the pull-up node inside the first shift register and a potential at the output terminal of the first shift register.

In the Gate Driver on Array circuit of the present disclosure, for each shift register after at least the third stage of the shift register in each group of shift registers, the shift register can use the gate driving signal outputted by another shift register connected before a shift register in a previous stage of the shift register as an initializing signal before starting to operate, and reset or initialize the potential at the pull-up node inside the shift register and/or the output terminal inside the shift register before starting to operate. As a whole, the Gate Driver on Array circuit according to the present disclosure can achieve, by initialization in a stage-by-stage manner within one frame, at least substantially the same technical effects as that of performing total resetting between frames, and do not increase load of the STY signal. It has no need to configure a clock control circuit separately, the signal timing control is simple, the circuit cost is low, and it is universally applicable for various products such as television and notebook computer.

BRIEF DESCRIPTION OF THE DRAWINGS

In order to more clearly illustrate the technical solutions of the embodiments of the present disclosure, the drawings of the embodiments will be briefly described below. It is obvious that the drawings in the following description merely relate to some embodiments of the present disclosure and are not intended to limit the present disclosure.

DETAILED DESCRIPTION OF THE EMBODIMENTS

Hereinafter, for the purposes, the technical solutions and the advantages of the embodiments of the present disclosure to be more clear, the technical solutions in the embodiments of the present disclosure will be described dearly and comprehensively in conjunction with the drawings in the embodiments of the present disclosure. Obviously, the described embodiments are only parts of the embodiments of the present disclosure, rather than all of the embodiments thereof. All the other embodiments obtained by those of ordinary skill in the art based on the embodiments described in the present disclosure without paying creative efforts fall into the protection scope of the present disclosure.

The GOA circuit comprises a plurality of shift registers in cascade. In order to prevent abnormal displaying of a current frame from affecting the picture in a next frame, and also to prevent black screen when powered on, a total reset function may be added for the GOA circuit, that is, during a blanking period between two frames (i.e., a certain time period starting from the completion of resetting of a pull-up node and an output terminal of the shift register in a last stage among each group of shift registers in the GOA circuit, until the reception of the frame start signal STV of a new frame by the shift register in a first stage among said each group of shift registers), a total reset signal supplied by a separately configured clock control circuit (T-CON) is used for simultaneously resetting or initializing pull-up nodes and/or output terminals of all shift registers in the GOA circuit.

Since the total reset signal can only be supplied between two frames, though having been through total reset, the shift register in the GOA circuit may still be disturbed by external factors before receiving an input signal, and the register which is connected at a latter position in the GOA circuit has a higher possibility of suffering from disturbance.

In addition, for making the GOA circuit have the total reset function, it is necessary to configure a separate clock control circuit, or use the STV signal as a total reset signal. For different products such as TV product and notebook computer, implementation of the total reset function is different, and there is no circuit design universally applicable.

For example, for the TV product, the STV signal may be used as a total reset signal TRST and sent simultaneously to each shift register in the GOA circuit of the TV product during a certain time period (e.g., the blanking period) between two frames. However, such implementation significantly increases load of the STY signal. At the same time, it is still necessary to separately configure the clock control circuit to control the occasion for sending the STY signal for total resetting.

Unlike the TV product, the STY signal for products such as the notebook computer or the like has a limited pulse width. If the total reset function is implemented in the same manner as that for the TV product, bezel of the products such as notebook computer or the like will be significantly increased. Therefore, for the products such as notebook computer or the like, it is adoptable that a separate total reset signal is provided during a certain time period (e.g., the blanking period) between two frames by a separately configured clock control circuit. However, in the case of adopting such implementation, the separately configured clock control circuit needs to output one more or two more control signals, and needs to control the occasion for sending the control signals, which make the timing control of signals very complicated.

In addition, in order to implement the total reset Ruction, it is necessary to add at least two additional transistors (respectively for initializing potentials at the pull-up node and at the output terminal) in each shift register in the GOA circuit. Therefore, bezel may be increased in varying degrees (depending on a size of the additional transistors), which is not beneficial to realize a slim bezel design of the display panel.

Figure 1:
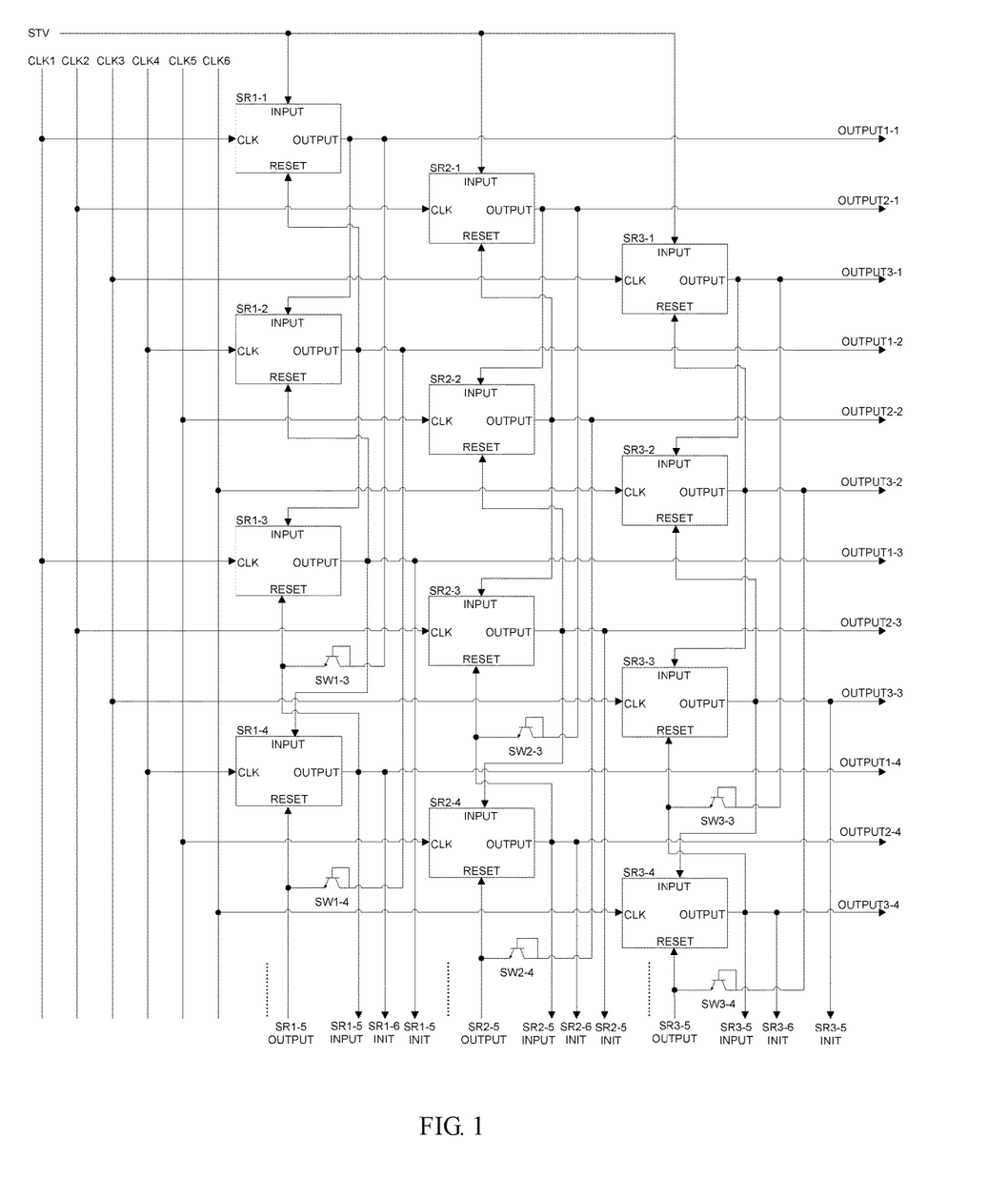
FIG. 1 illustrates an exemplary connection manner of a shift register in a Gate Driver on Array circuit according to an embodiment of the present disclosure.

The Gate Driver on Array circuit shown in FIG. 1 comprises at least one group of shift registers, and each group of shift registers includes a plurality of shift registers. In each group of shift registers, an input terminal of the shift register in the first stage receives a STY signal, and input terminals of the shift registers in other stages after the first stage is respectively connected to output terminals of the shift register in respective previous stage thereof, so as to receive a gate driving signal outputted from the shift register in a previous stage as an input signal, thereby the plurality of shift registers in each group of shift registers are cascaded. For the convenience of description, in this document, "SRi-j" denotes the shift register cascaded in a j-th stage in an i-th group of shift registers, wherein the shift register SRi-j is located in a previous stage of the shift register SRi-(j+1), the shift register SRi-(j+1) is located in a next stage of the shift register SRi-j. Accordingly, OUTPUTi-j denotes the gate driving signal outputted from the shift register SRi-j.

For example, as shown in FIG. 1, the first group of shift registers includes a plurality of shift registers SR1-1, SR1-2, SR1-3, SR1-4, etc., wherein an input terminal INPUT of the shift register SR1-1 located in a first stage receives a STV signal; an input terminal INPUT of the shift register SR1-2 located in a second stage is connected to an output terminal OUTPUT of the shift register SR1-1 to receive a gate driving signal OUTPUT1-1 outputted from the shift register SR1-1 as an input signal; an input terminal INPUT of the shift register SR1-3 in a third stage is connected to an output terminal OUTPUT of the shift register SR1-2 to receive a gate driving signal OUTPUT1-2 outputted from the shift register SR1-2 as an input signal; an input terminal INPUT of the shift register SR1-4 in a fourth stage is connected to an output terminal OUTPUT of the shift register SR1-3 to receive a gate driving signal OUTPUT1-3 outputted from the shift register SR1-3 as an input signal, and so on, so that the plurality of shift registers SR1-1, SR1-2, SR1-3, SR1-4 and others as included in the first group of shift registers are cascaded together.

Each shift register SRi-j is further provided with a clock signal terminal CLK for receiving a clock signal from a corresponding clock signal line (e.g., CLK1 to CLK6 shown in FIG. 1) and a reset terminal RESET for receiving a reset signal. The reset terminal RESET of each shift register SRi-j is connected to an output terminal OUTPUT of the shift register SRi-(j+1) cascaded in a next stage, so as to use a gate driving signal OUTPUTi-(j+1) outputted from the shift register SRi-(j+1) as its reset signal. For example, in FIG. 1, the reset terminal RESET of the shift register SR1-1 is connected to the output terminal OUTPUT of the shift register SR1-2 cascaded in a next stage, so as to use the gate driving signal OUTPUT1-2 outputted from the shift register SR1-2 as its reset signal. As another example, the reset terminal RESET of the shift register SR3-2 is connected to the output terminal OUTPUT of the shift register SR3-3 cascaded in a next stage, so as to use the gate driving signal OUTPUT3-3 outputted from the shift register SR3-3 as its reset signal.

It will be appreciated that, the manner in which the reset signals are supplied to the shift registers in the respective stages shown in FIG. 1 is merely exemplary. In some embodiments, each shift register may use a gate driving signal outputted by any one or more shift registers which is connected after the shift register as a reset signal. For example, the shift register SR1-1 may use any one or more of gate driving signals OUTPUT 1-2, OUTPUT 1-3, OUTPUT 1-4, OUTPUT 1-5 (not shown) and the like outputted by any one or more of the shift registers SR1-2, SR1-3, SR1-4, SR1-5 (not shown) or the like as the reset signal, wherein in a case where a plurality of gate driving signals outputted from a plurality of shift registers connected subsequently are used as reset signals, the shift register SR1-1 may be reset many times after outputting the gate driving signal OUTPUT1-1, and may also be reset only once or several times under control of, for example, a clock signal and/or an internal logic control circuit.

In addition, in some embodiments, each shift register may also supply its outputted gate driving signal to the reset terminal of any one or more shift registers connected before the shift register as the reset signal of said one or more shift registers. For example, the output terminal OUTPUT of the shift register SR2-4 may be connected to the reset terminal RESET of any one or more of the shift registers SR2-1, SR2-2 and SR2-3, and the gate driving signal OUTPUT2-4 outputted from the shift register SR2-4 may be used as a reset signal of any one or more of the shift registers SR2-1, SR2-2, and SR2-3.

In addition, each shift register SRi-j can supply its outputted gate driving signal OUTPUTi-j to the reset terminal RESET of any one or more shift registers connected after the shift register SRi-(j+1), to serve as an initializing signal for initialization before said one or more shift registers start to operate. For example, the gate driving signal OUTPUTi-j outputted from each shift register SRi-j is also provided to the reset terminal RESET of the shift register SRi-(j+2). For example, in the Gate Driver on Array circuit shown in FIG. 1, the output terminal OUTPUT of the shift register SR1-1 is also connected to the reset terminal RESET of the shift register SR1-3.

As shown in FIG. 1, the reset terminal RESET of the shift register SRi-(j+2) (e.g., shift register SR1-3) is connected to the output terminal OUTPUT of the shift register SRi-j (e.g., the shift register SR1-1) and the output terminal OUTPUT of the shift register SRi-(j+3) (e.g., the shift register SR1-4), and when the shift register SRi-(j+3) outputs the gate driving signal OUTPUTi-(j+3), the shift register SRi-j has completed output of the gate driving signal, and the output terminal OUTPUT of the shift register SRi-j should be maintained at a reset potential state at this moment, Thus, in order to prevent the gate driving signal OUTPUTi-(j+3) outputted by the shift register SRi-(j+3) from adversely affecting the output terminal OUTPUT of the shift register SRi-j, a unidirectional conducting switch SWi-(j+2) may be provided between the output terminal OUTPUT of the shift register SRi-j and the reset terminal of the shift register SRi-(j+2), wherein the input terminal of the unidirectional conducting switch SWi-(j+2) is connected to the output terminal OUTPUT of the shift register SRi-j, and the output terminal of the unidirectional conducting switch SWi-(j+2) is connected to the reset terminal RESET of the shift register SRi-(j+2), thereby ensuring that the signal is always unidirectionally transmitted from the output terminal OUTPUT of the shift register SRi-j to the reset terminal RESET of the shift register SRi-(j+2), so as to prevent the signal from being transmitted in the opposite direction. For example, as shown in FIG. 1, a unidirectional conducting switch SW1-3 may be provided between the output terminal of the shift register SR1-1 and the reset terminal of the shift register SR1-3, and a unidirectional conducting switch SW3-4 may be provided between the output terminal of the shift register SR3-2 and the reset terminal of the shift register SR3-4.

At this time, if the unidirectional conducting switch SWi-(j+2) is regarded as a part of the shift register SRi-(j+2), the input terminal of the unidirectional conducting switch SWi-(i+2) may be regarded as the initializing terminal of the shift register SRi-(j+2), and the gate driving signal OUTPUTi-j supplied from the shift register SRi-j may be regarded as an initializing signal for initialization before the shift register SRi-(j+2) starts to operate.

In an embodiment, the unidirectional conducting switch may be implemented by adopting transistors (e.g., the unidirectional conducting switch SW1-3 in FIG. 1). In such case, for example, the control terminal and the first terminal of the transistor may be connected together and used as the input terminal of the unidirectional conducting switch, and the second terminal of the transistor may be used as the output terminal of the unidirectional conducting switch. In another embodiment, the unidirectional conducting switch may be implemented by a diode, wherein, for example, the input terminal of the diode is used as the input terminal of the unidirectional conducting switch, and the output terminal of the diode is used as the output terminal of the unidirectional conducting switch. In other embodiments, the unidirectional conducting switch may employ any other element and/or circuit applicable for an integrated circuit and having the unidirectional conducting capability.

It should be understood that, the shift register SRi-j in the Gate Driver on Array circuit shown in FIG. 1 may have any appropriate circuit structure as necessary, and each shift register SRi-j may employ a same or different circuit implementation as needed.

Figure 2:
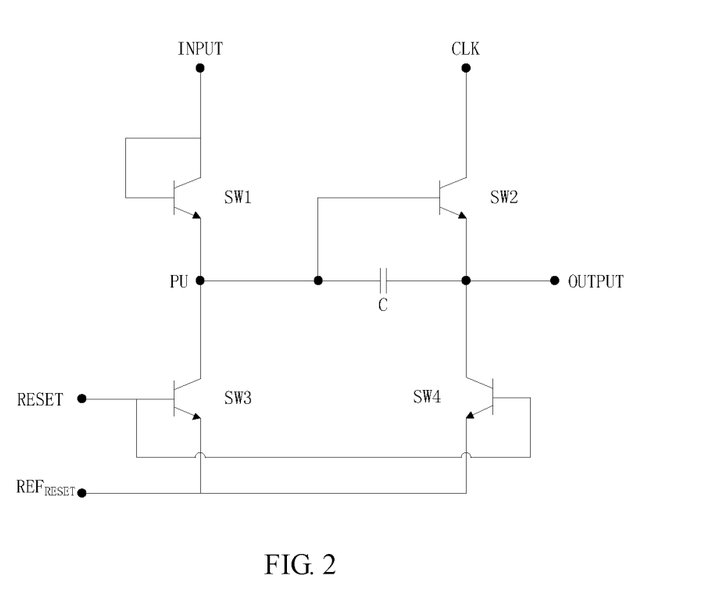
FIG. 2 illustrates an exemplary structure of a shift register that can be used in a Gate Driver on Array circuit according to an embodiment of the present disclosure.

FIG. 2 illustrates an exemplary structure of a shift register that may be used in a Gate Driver on Array circuit according to an embodiment of the present disclosure. The shift register shown in FIG. 2 comprises an input circuit, an output circuit, and a reset circuit. The input circuit comprises a switching element SW1, wherein the control terminal and the first terminal of the switching element SW1 are connected together to serve as the input terminal INPUT of the shift register, and the second terminal of the switching element SW1 is connected to a pull-up node PU inside the shift register. The output circuit comprises a switching element SW2 and a capacitor C, wherein the control terminal of the switching element SW2 and one terminal of the capacitor C are connected together to the pull-up node PU, the first terminal of the switching element SW2 is connected to the clock signal terminal CLK of the shift register, the second terminal of the switching element SW2 and the other terminal of the capacitor C are connected to the output terminal OUTPUT of the shift register. The reset circuit comprises a switching element SW3 and a switching element SW4, wherein control terminals of the switching element SW3 and the switching element SW4 are connected together and connected to the reset terminal RESET of the shift register, the first terminal of the switching element SW3 is connected to the pull-up node PU, the first terminal of the switching element SW4 is connected to the output terminal OUTPUT of the shift register, and potentials at the second terminals of the switching element SW3 and the switching element SW4 are set to a reset potential. The switching elements in the shift register may be any type of transistors, field effect transistors, etc., which is not limited herein.

When simply considering the operation of one shift register, the shift register shown in FIG. 2 starts to operate when receiving an input signal via its input terminal INPUT, the switching element SW1 in the input circuit is turned on, the potential at the pull-up node PU becomes an operating potential (e.g., a high voltage level), so as to charge the capacitor C in the output circuit. Thereafter, when a clock signal is received via the clock signal terminal (MK, the switching element SW2 in the output circuit is turned on, so as to output the gate driving signal at the output terminal OUTPUT, and the pull-up node PU is maintained at the operating potential due to bootstrapping of the capacitor C. Afterwards, when a reset signal is received via the reset terminal RESET, the switching elements SW3 and SW4 in the reset circuit are turned on. Since the second terminals of the switching elements SW3 and SW4 are set to a reset potential (e.g., a low voltage level), the potentials at the pull-up node PU and the output terminal OUTPUT are reset to the reset potential. Then, in the absence of external interference, the potentials at the pull-up node PU and the output terminal OUTPUT are maintained at the reset potential until the shift register receives the next input signal, thereby avoiding abnormal display of picture caused by multi-output.

Figure 3:
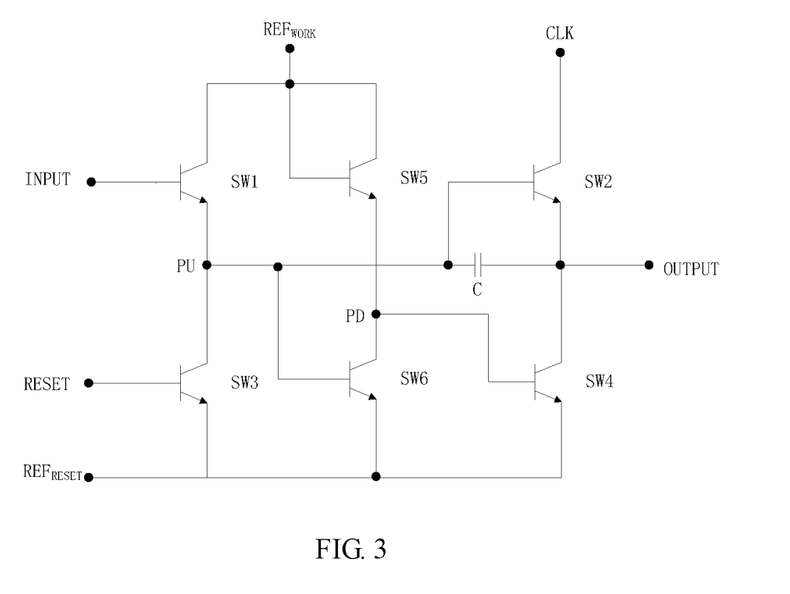
FIG. 3 illustrates an exemplary structure of another shift register that can be used in a Gate Driver on Array circuit according to an embodiment of the present disclosure.

FIG. 3 illustrates an exemplary structure of another shift register that can be used in a Gate Driver on Array circuit according to an embodiment of the present disclosure. In the exemplary shift register shown in FIG. 3, the control terminal of the switching element SW4 is not directly connected to the reset terminal RESET of the shift register, instead, switching elements SW5 and SW6 are added inside the shift register. When the shift register receives a reset signal at its reset terminal RESET, the switching element SW3 is turned on, so that the potential at the pull-up node PU becomes the reset potential, and further, the switching element SW6 is turned off. Since the switching element SW5 is in a turn-on state, the potential at a pull-down node PD located at the first terminal of the switching element SW6 becomes the operating potential at this time. When the potential at the pull-down node PD becomes the operating potential, the switching element SW4 is turned on, so that the potential at the output terminal OUTPUT of the shift register becomes the reset potential.

It should be understood that, besides the exemplary structure of the shift register shown in FIGS. 2 and 3, the shift register in the Gate Driver on Array circuit according to an embodiment of the present disclosure shown in FIG. 1 may also employ other circuit structures. However, basic functions and basic principles of the various shift registers are the same.

Figure 4:
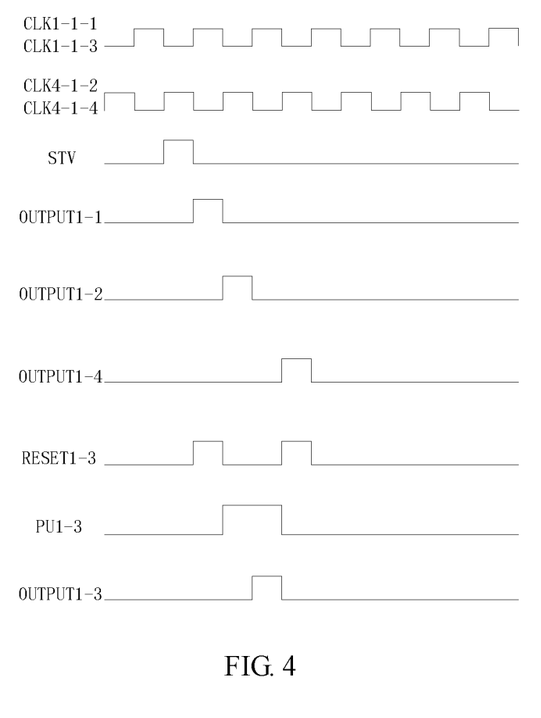
FIG. 4 illustrates an exemplary operating timing of a shift register in a Gate Driver on Army circuit according to an embodiment of the present disclosure.

FIG. 4 shows operation timing of the shift register SR1-3 in the Gate Driver on Array circuit shown in FIG. 1, wherein CLK1-1-1 and CLK1-1-3 denote the clock signals supplied to the shift registers SR1-1 and SR1-3 via the clock signal line CLK1 in FIG. 1, CLK4-1-2 and CLK4-1-4 denote the clock signals supplied to the shift registers SR1-2 and SR1-4 via the clock signal line CLK4 in FIG. 1, RESET1-3 denotes the potential at the reset terminal RESET of the shift register SR1-3, and PU1-3 denotes the potential at the pull-up node PU inside the shift register SR1-3. It should be noted that the timing relationships as shown in FIG. 4 of the clock signals provided via the clock signal lines CLK1 and CLK4 in FIG. 1 are merely exemplary.

As shown in FIG. 4, after receiving the STY signal, the shift register SR1-1 outputs the gate driving signal OUTPUT1-1 when receiving the clock signal CLK1-1-1 (i.e., the potential of the CLK1-1-1 is the operating potential, e.g., a high voltage level). The outputted gate driving signal OUTPUT1-1 will be provided to the input terminal INPUT of the shift register SR1-2 and the reset terminal RESET of the shift register SR1-3, so that the potential RESET1-3 at the reset terminal RESET of the shift register SR1-3 becomes the operating potential. With reference to FIG. 2 or FIG. 3, at this moment, the reset circuit inside the shift register SR1-3 operates, so that the potential PU1-3 at the pull-up node PU inside the shift register SR1-3 and the potential OUTPUT1-3 at the output terminal OUTPUT of the shift register SR1-3 both are the reset potential, thereby completing initialization before starting to operate.

Next, the shift register SR1-2 outputs the gate driving signal OUTPUT1-2 and supplies it to the input terminal INPUT of the shift register SR1-3. After the shift register SR1-3 receives the input signal, in conjunction with FIG. 2 or FIG. 3, the potential PU1-3 at the pull-up node PU inside the shift register SR1-3 becomes the operating potential, and the capacitor C in the output circuit starts to be charged. However, since the clock signal CLK1-1-3 (the CLK1-1-3 is not at the operating potential currently) is not received at this time, the switching element SW2 in the output circuit inside the shift register SR1-3 is not turned on, thus the output terminal OUTPUT of the shift register SR1-3 does not output the gate driving signal OUTPUT1-3 (i.e., the potential at the OUTPUT1-3 at this time is still the reset potential).

Afterwards, when the shift register SR1-3 receives the clock signal CLK1-1-3, the potential PU1-3 at the pull-up node PU inside the shift register SR1-3 is maintained at the operating potential due to bootstrap effect of the capacitor C, so that the output circuit starts to operate (i.e., the switching element SW2 in the output circuit is turned on), accordingly, the gate driving signal OUTPUT1-3 is outputted at the output terminal OUTPUT. The outputted gate driving signal OUTPUT 1-3 is simultaneously supplied to the shift register SR1-4 in a next stage as an input signal of the shift register SR1-4.

After outputting the gate driving signal OUTPUT1-3, the shift register SR1-3 receives, at its reset terminal RESET, the gate driving signal OUTPUT1-4 outputted from the shift register SR1-4, so that the potential RESET1-3 at its reset terminal RESET becomes the operating potential again. At this time, the reset circuit inside the shift register SR1-3 operates again, so that the potential PU1-3 at the pull-up node PU inside the shift register SR1-3 and the potential OUTPUT1-3 at the output terminal OUTPUT of the shift register SR1-3 both are the reset potential, so that the resetting is completed after the output of the gate driving signal OUTPUT1-3.

For any shift registers SRi-j (j>=3) in FIG. 1, the operation process thereof is similar to that of the shift register SR1-3 shown in FIG. 4, and no details will be repeated herein.

In the Gate Driver on Array circuit as shown in FIG. 1, any shift register SRi-(j+2) (j>=1) can, before it starts to operate (i.e., before receiving an input signal), receives, at its reset terminal RSET, the gate driving signal OUTPUTi-j from the shift register SRi-j as its initializing signal to perform initialization on the potential(s) at its internal pull-up node PU and/or its output terminal OUTPUT before starting to operate.

As a whole, the Gate Driver on Array circuit shown in FIG. 1 can initialize all the shift registers SRi-(j+2) (j>=1) stage-by-stage within one frame, and there is no need to add a total reset function for the Gate Driver on Array circuit to take a total reset on all the shift registers in the Gate Driver on Array circuit between two frames. Moreover, the Gate Driver on Array circuit according to an embodiment of the present disclosure does not increase load of the STY signal, and does not need to separately provide a clock control circuit. The signal timing control is simple, the circuit cost is low, and it is universally applicable for various products such as television and notebook computer.

In the case of adopting the connection manner shown in FIG. 1, each shift register SRi-(j+2) (j>=1) could receive the initializing signal and be initialized just before starting to operate, and could be reset immediately after outputting the gate driving signal. Therefore, it could be effectively avoided that the shift register may suffer from disturbance by external noise due to being initialized prematurely before starting to operate, thereby more effectively suppressing noise accumulation, and further improving accuracy and stability of the output signal of the GOA circuit.

The manner in which the initializing signal is supplied to each stage of the shift register shown in FIG. 1 is merely exemplary. If necessary, the gate driving signal OUTPUTi-j outputted from the shift register SRi-j may be supplied to the reset terminal RESET of any one or more of the shift registers connected after the shift register SRi-(j+1). For example, the output terminal OUTPUT of the shift register SR1-1 may be, for example, connected to the reset terminal of the shift register SR1-4 via the unidirectional conducting switch SW1-4, or the output terminal OUTPUT of the shift register SR1-1 may also be, for example, connected to the reset terminals of the shift registers SR1-3 and SR1-4 via the unidirectional conducting switches SW1-3 and SW1-4 respectively, or the output terminal OUTPUT of the shift register SR1-1 may also be, for example, connected to the reset terminals of the shift registers SR1-3 and SR1-5 via the unidirectional conducting switches SW1-3 and SW1-5 respectively. If condition allows (e.g., the gate driving signal OUTPUT1-1 outputted from SR1-1 has a sufficient pulse width), the output terminal OUTPUT of the shift register SR1-1 may even be connected to the reset terminal RESET of all the shift registers SR1-j (j≥3) except the shift register SR1-2 in the first group of shift registers via multiple unidirectional conducting switches respectively.

In addition, although three groups of shift registers and six clock signal lines CLK1 to CLK6 are shown in FIG. 1, the present disclosure makes no limitations to the number of groups of shift registers and the number of clock signal lines. For example, it is possible to configure one group of shift registers and two clock signal lines, or configure two groups of shift registers and four clock signal lines. In general, the relationship between the number of groups of shift registers and the number of the clock signal lines may be set to 1:2. According to the current experimental results, when adopting three groups of shift registers and six clock signal lines, the effect obtained in terms of performance is relatively better.

As described above, anyone of shift registers in the Gate Driver on Array circuit according to the present disclosure may employ any suitable circuit structure. For example, the exemplary shift register shown in FIG. 2 or 3 and any variations based on the exemplary shift register shown in FIG. 2 or 3 may be applied to the Gate Driver on Array circuit according to the present disclosure.

Figure 5:
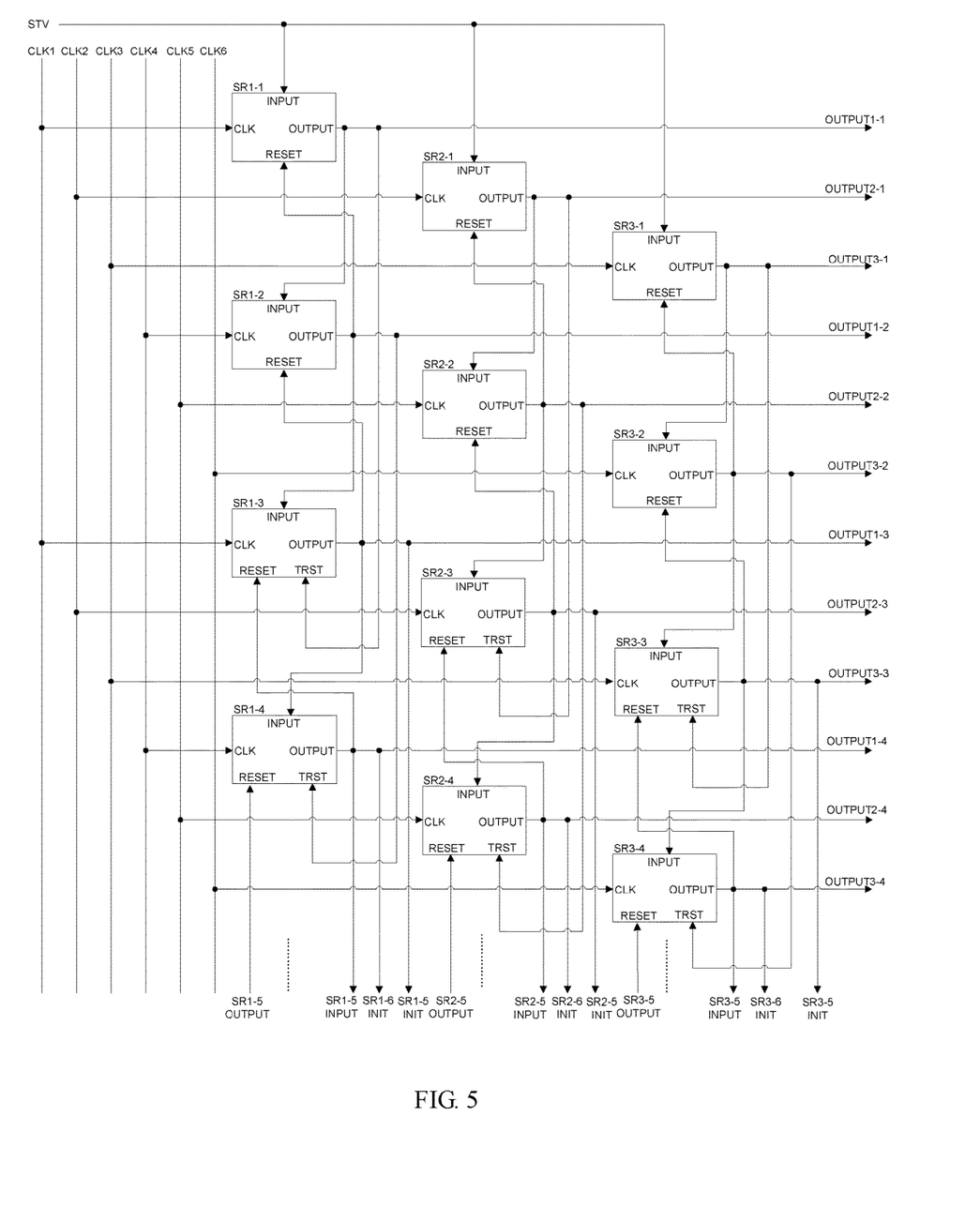
FIG. 5 illustrates another exemplary connection manner of a shift register in a Gate Driver on Array circuit according to an embodiment of the present disclosure.

FIG. 5 illustrates another exemplary connection manner of shift registers in a Gate Driver on Array circuit according to an embodiment of the present disclosure. In a case where the shift register itself supports the total reset function (correspondingly, provided with a total reset terminal TRST and a total reset circuit), as shown in FIG. 5, it is not necessary to configure a separate unidirectional conducting switch SWi-(j+2) between the output terminal of the shift register SRi-j and the reset terminal of the shift register SRi-(j+2), instead, it is possible to directly take the total reset terminal TRST of the shift register SRi-(j+2) as the initializing terminal and connect it to the output terminal OUTPUT of the shift register SRi-j.

In addition, a shift register provided with a dedicated initializing terminal may also be used in the Gate Driver on Array circuit according to the present disclosure.

Figure 6:
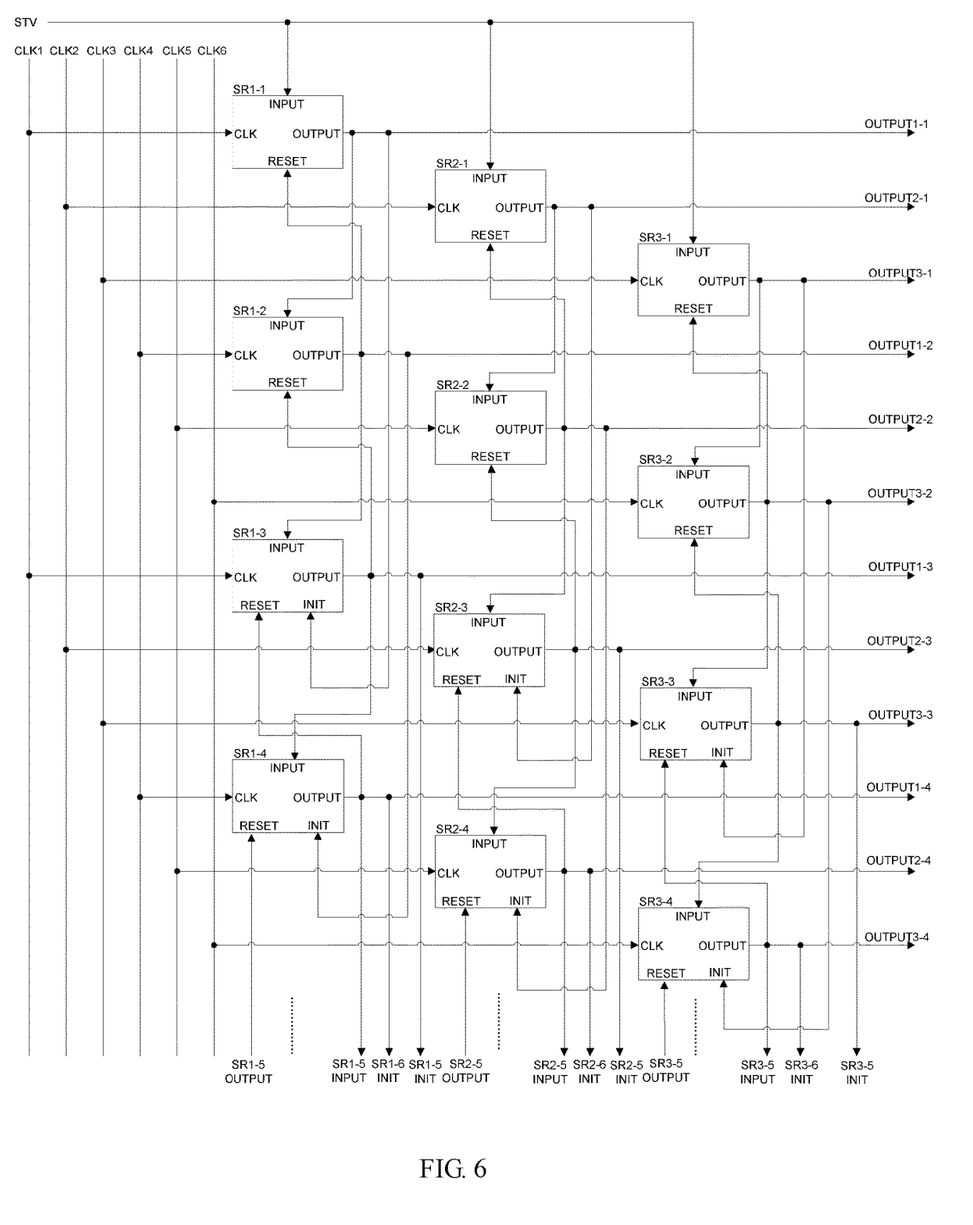
FIG. 6 illustrates another exemplary connection manner of a shift register in a Gate Driver on Array circuit according to an embodiment of the present disclosure.

FIG. 6 illustrates another exemplary connection manner of shift registers in a Gate Driver on Array circuit according to an embodiment of the present disclosure. In this embodiment, the shift register SRi-(j+2) (j>=1) in the Gate Driver on Array circuit is also provided with an initializing terminal dedicated. As shown in FIG. 6, in the Gate Driver on Array circuit, the shift register SRi-(j+2) is provided with an initializing terminal, and the initializing terminal of the shift register SRi-(j+2) is directly connected to the output terminal OUTPUT of the shift register SRi-j.

FIGS. 7 to 13 illustrate exemplary structures of a shill register provided with an initializing terminal according to an embodiment of the present disclosure, respectively.

Figure 7:
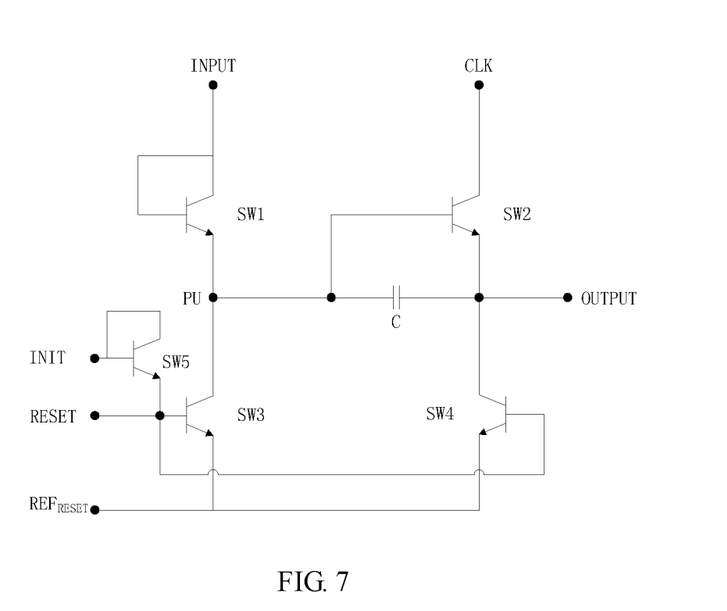
FIG. 7 illustrates an exemplary structure of a shift register provided with an initializing terminal according to an embodiment of the present disclosure.

The exemplary shift register shown in FIG. 7 is added with an initializing terminal INIT and an initializing circuit on basis of the shift register shown in FIG. 2, The initializing circuit may comprise a switching element SW5, wherein the control terminal and the first terminal of the switching element SW5 are connected together and connected to the initializing terminal INIT of the shift register, and the second terminal of the switching element SW5 is connected to the control terminals of the switching element SW3 and the switching element SW4 in the reset circuit and connected to the reset terminal RESET of the shift register. When the initializing signal is received via the initializing terminal MIT, the switching element SW5 in the initializing circuit is turned on, so that the switching element SW3 and the switching element SW4 in the reset circuit are turned on, thereby making the potential at the pull-up node PU and the potential at the output terminal OUTPUT become the reset potential. Thereby, the shift register completes initialization.

Figure 8:
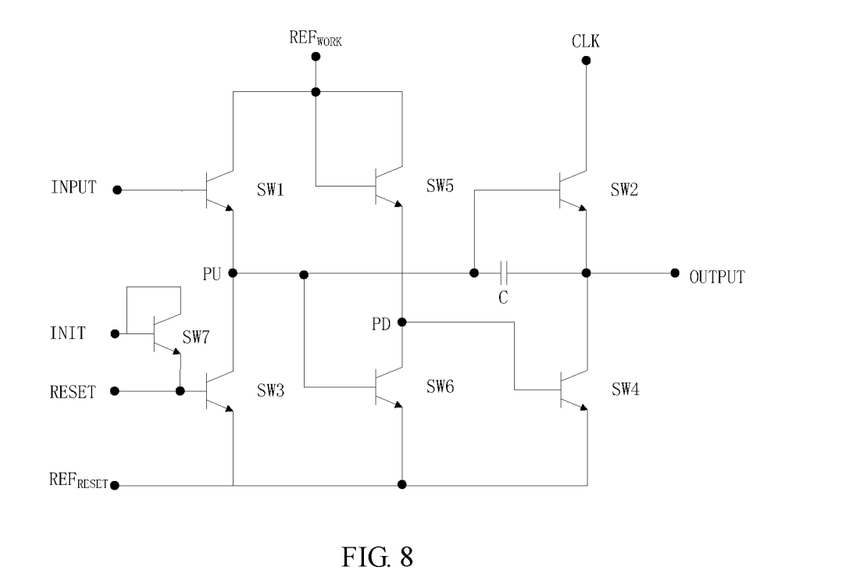
FIG. 8 illustrates an exemplary structure of a shift register provided with an initializing terminal according to an embodiment of the present disclosure.

The exemplary shift register shown in FIG. 8 is added with an initializing terminal INIT and an initializing circuit on basis of the shift register shown in FIG. 3. The initializing circuit may include a switching element SW7, wherein the control terminal and the first terminal of the switching element SW7 are connected together and connected to the initializing terminal INIT of the shift register, and the second terminal of the switching element SW7 is connected to the control terminal of the switching element SW3 in the reset circuit and connected to the reset terminal RESET of the shift register. When the initializing signal is received via the initializing terminal INIT, the switching element SW7 in the initializing circuit is turned on, so that the potential at the reset terminal RESET of the shift register becomes the potential of the initializing signal. This could correspond to receiving a reset signal at the reset terminal RESET of the shift register. Therefore, when the initializing signal is received via the initializing terminal INIT, the potential at the pull-up node PU and the potential at the output terminal OUTPUT, of the shift register become the reset potential, thereby completing initialization for the shift register.

The exemplary shift register shown in FIG. 7 or FIG. 8 could be obtained by taking the unidirectional conducting switch SWi-(j+2) and the shift register SRi-(j+2) in FIG. 1 as a whole, wherein the input terminal of the unidirectional conducting switch SWi-(j+2) corresponds to the initializing terminal INIT of the shift register SRi-(j+2).

Figure 9:
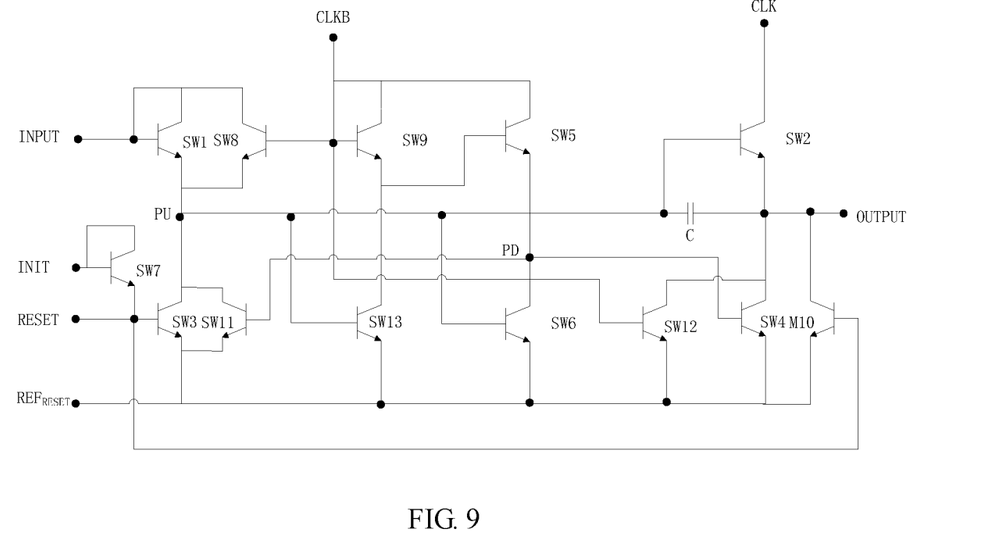
FIG. 9 illustrates an exemplary structure of a shift register provided with an initializing terminal according to an embodiment of the present disclosure.

Other shift registers can be designed in a similar manner. For example, FIG. 9 illustrates a variation of the shift register according to an embodiment of the present disclosure, wherein the shift register is further provided with an inverted clock signal terminal CLKB (a clock signal received via the CLKB may be, for example, opposite in phase with respect to the clock signal received via the clock signal terminal CLK), and also includes switching elements SW8 to SW13. However, basic functions and operation principles of such shift registers are the same as those of the exemplary shift register shown in FIG. 7 or FIG. 8, thus no description is repeated herein.

Figure 10:
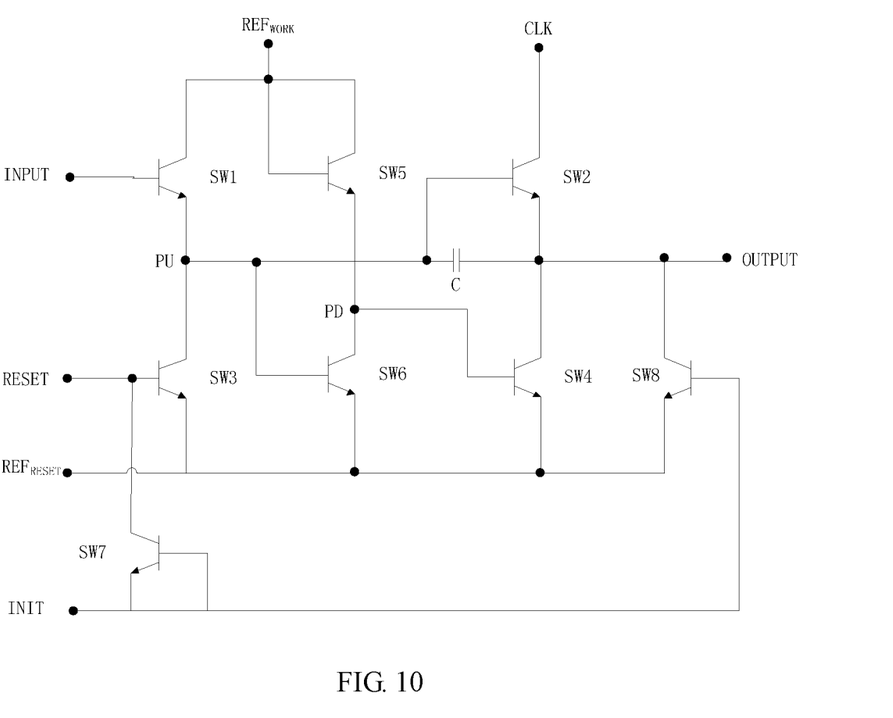
FIG. 10 illustrates an exemplary structure of a shift register provided with an initializing terminal according to an embodiment of the present disclosure.
Figure 11:
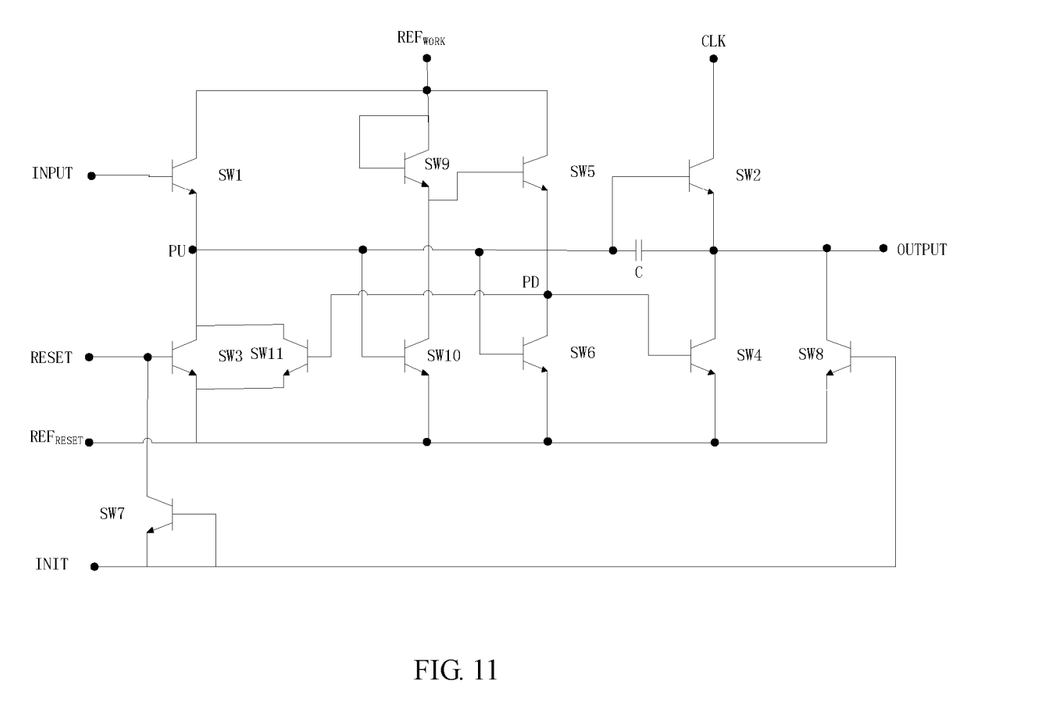
FIG. 11 illustrates an exemplary structure of a shift register provided with an initializing terminal according to an embodiment of the present disclosure.

FIG. 10 illustrates an exemplary structure of a shift register provided with an initializing terminal and an initializing circuit according to an embodiment of the present disclosure. In the shift register shown in FIG. 10, the initializing circuit further includes a switching element SW8, the control terminal of which is connected to the initializing terminal, the first terminal of which is connected to the output terminal OUTPUT of the shift register, and the potential at the second terminal of which is set to be the reset potential $REF_{RESET}$. In this way, when the shift register receives the initializing signal via the initializing terminal INIT, the potential at the output terminal OUTPUT can be reset by the switching element SW8. With respect to the circuit structure shown in FIG. 8, the initializing circuit in the shift register shown in FIG. 10 has a stronger ability to initialize the output terminal OUTPUT. Of course, the switching element SW8 may not be provided in consideration of a slim bezel.

Other shift registers may be designed in a manner similar to FIG. 10. For example, FIG. 1I shows a variation of the shift register shown in FIG. 10, wherein the shift register further includes switching elements SW9 to SW11. However, as for the exemplary shift register shown in FIG. 11, its basic functions and operating principles are the same as those of the exemplary shift register shown in FIG. 10, thus no description is repeated herein.

Figure 12:
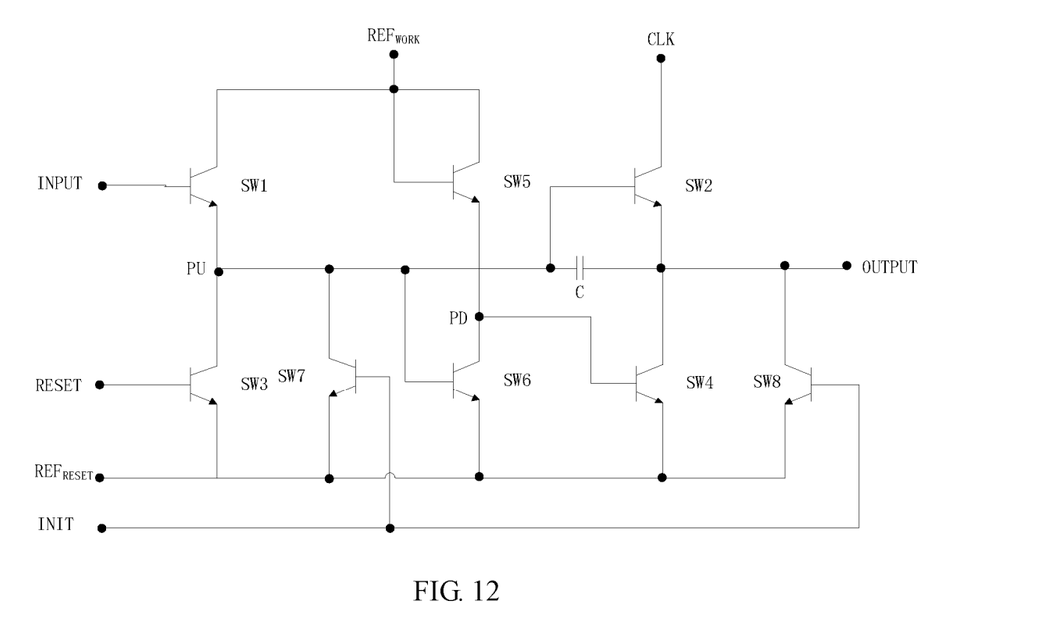
FIG. 12 illustrates an exemplary structure of a shift register provided with an initializing terminal according to an embodiment of the present disclosure.

FIG. 12 illustrates an exemplary structure of a shift register provided with an initializing terminal and an initializing circuit according to another embodiment of the present disclosure. In FIG. 12, the first terminal of the switching element SW7 in the initializing circuit is connected to the pull-up node PU, the control terminal of the switching element SW7 is connected to the initializing terminal INIT, and the potential of the second terminal of the switching element SW7 is set to the reset potential $REF_{RESET}$. In this way, when the shift register receives the initializing signal via the initializing terminal INIT, the potential at the pull-up node PU can be directly initialized via the switching element SW7 in the initializing circuit. In addition, the initializing circuit may also include a switching element SW8, the first terminal of the switching element SW8 is connected to the output terminal OUTPUT, the control terminal of the switching element SW8 is connected to the initializing terminal INIT, and the potential of the second terminal of the switching element SW8 is set to the reset potential $REF_{RESET}$ so as to initialize the potential at the output terminal OUTPUT when receiving an initializing signal. Of course, the switching element SW8 may not be provided in consideration of a slim bezel.

Figure 13:
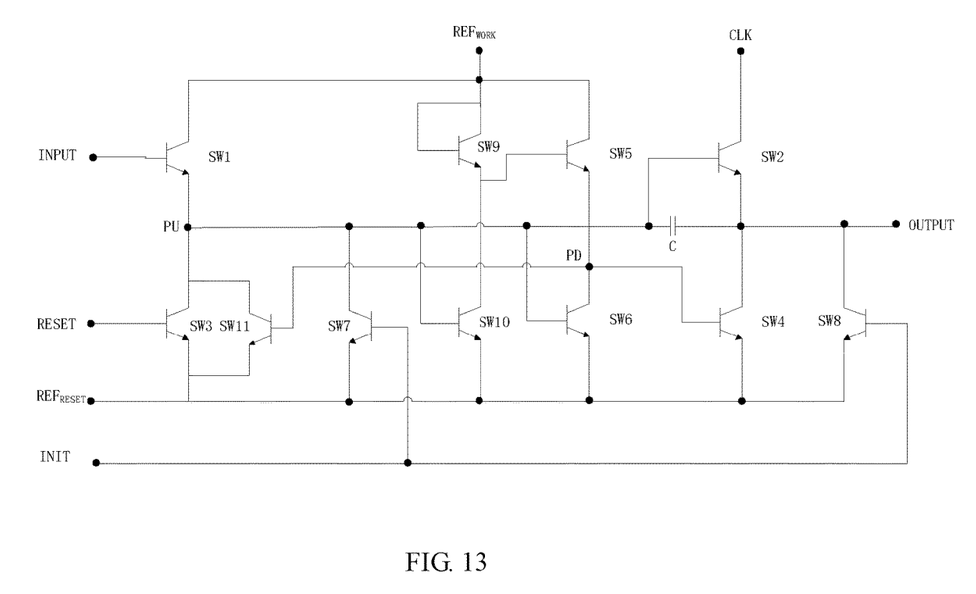
FIG. 13 illustrates an exemplary structure of a shift register provided with an initializing terminal according to an embodiment of the present disclosure.

Other shift registers can be designed in a manner similar to FIG. 12. For example, FIG. 13 shows a variation of the shift register shown in FIG. 12, wherein the shift register further includes switching elements SW9 to SW11. However, structure of the exemplary shift register shown in FIG. 13 is more complex, its basic functions and operating principles are the same as those of the exemplary shift register shown in FIG. 12, thus no description is repeated herein.

Only a few examples of the shift register that can be used in the Gate Driver on Array circuit according to an embodiment of the present disclosure are given above. The shift register that can be used in the Gate Driver on Array circuit according to the embodiment of the present disclosure is not limited thereto. As described above, the shift register SRi-j in the Gate Driver on Array circuit according to an embodiment of the present disclosure may employ a shift register having any suitable circuit structure, and each shift register SRi-j may adopt the same or different circuit implementation as needed. For example, in an embodiment, even if the shift register is provided with the total reset terminal TRST or the initializing terminal INIT, the Gate Driver on Array circuit may also adopt the connection manner of the Gate Driver on Array circuit as shown in FIG. 1 regardless of the total reset terminal TRST or the initializing terminal INIT.

In addition, the switching elements in the various shift registers mentioned above may employ various types of transistors, field effect transistors etc. as needed, and the present disclosure makes no limitations thereto.

Figure 14:
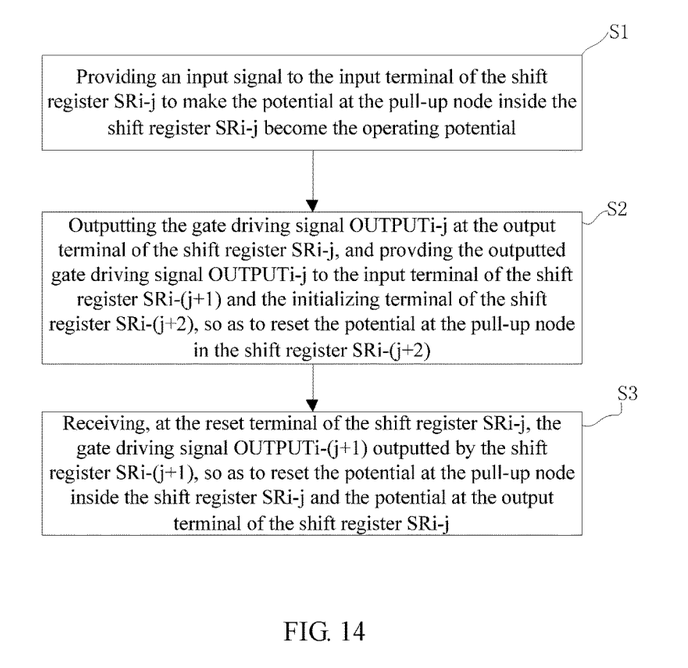
FIG. 14 illustrates an exemplary method for driving a shift register in a Gate Driver on Array circuit according to an embodiment of the present disclosure.

FIG. 14 shows a flowchart of a method for driving a Gate Driver on Array circuit according to an embodiment of the present disclosure.

As shown in FIG. 14, for each shift register SRi-j in the Gate Driver on Array circuit, in step S1, an input signal is supplied to the input terminal of the shift register SRi-j to make the potential at the pull-up node inside the shift register SRi-j become the operating potential; thereafter, in step S2, the gate driving signal OUTPUTi-j is outputted at the output terminal of the shift register SRi-j, and the outputted gate driving signal OUTPUTi-j is supplied to the input terminal of the shift register SRi-(j+1) and the initializing terminal of the shift register SRi-(j+2), so as to reset the potential at the pull-up node in the shift register SRi-(j+2); next, in step S3, the reset terminal of the shift register SRi-j receives the gate driving signal OUTPUTi-(j+1) outputted by the shift register SRi-(j+1), so as to reset the potential at the node in the shift register SRi-j and the potential at the output terminal of the shift register SRi-j. Thus, the method can drive the Gate Driver on Array circuit according to the present disclosure to initialize all the shift registers SRi-(j+2) (j>=1) stage by stage within one frame, so that it is not necessary to add a total reset function for the Gate Driver on Array circuit to perform a total reset on all shift registers in the Gate Driver on Array circuit between two frames.

The Gate Driver on Array circuit according to the present disclosure has low implementation cost, simple signal control, and facilitates implementing a slim bezel of the display panel, so it can be applied to various sizes of panels and/or display devices, and can be also used in various fields such as large-size splicing screens, vehicle-mounted display devices, it can also be applied to various manufacturing processes such as a-Si Oxide, LTPS, and HIPS. Accordingly, an embodiment of the present disclosure provides a display device comprising any one of the Gate Driver on Array circuits described above.

As will be appreciated, the above embodiments are merely exemplary implementations for illustrating the principles of the present disclosure. However, the present disclosure is not limited thereto. For a person of ordinary skill in the art, various variations and improvements may be made without departing from the spirit of the present disclosure, and these variations and improvements are also within the scope of the present disclosure.

What is claimed is:

1. A Gate Driver on Array circuit, comprising at least one group of shift registers, each group of shift registers including a plurality of shift registers in cascade, the plurality of shift registers including a first shift register, a second shift register connected after the first shift register, and a third shift register connected after the second shift register, wherein the third shift register is provided with an initializing terminal which is connected to an output terminal of the first shift register, wherein the third shift register comprises an initializing sub-circuit configured to receive an initializing signal via the initializing terminal of the third shift register, and reset a potential at a pull-up node inside the third shift register according to the received initializing signal, wherein the initializing sub-circuit comprising a first transistor and a second transistor, a source and a gate of the first transistor being connected together and connected to the initializing, terminal of the third shift register, and a drain of the first transistor being connected to a reset terminal of the third shift register; and a gate of the second transistor being connected to the drain of the first transistor, a source of the second transistor being connected to an output terminal of the third shift register, and a potential at a drain of the second transistor being set to a reset potential.

2. The Gate Driver on Array circuit according to claim 1, wherein in a case where the third shift register is provided with a total reset terminal, the total reset terminal is used as the initializing terminal.

3. The Gate Driver on Array circuit according to claim 1, wherein the third shift register comprises:
   an input sub-circuit, configured to receive an input signal via an input terminal of the third shift register, and control a potential at the pull-up node according to the received input signal.

4. The Gate Driver on Array circuit according to claim 3, wherein the third shift register comprises:
   an output sub-circuit, configured to receive a clock signal via a clock signal terminal of the third shift register, and control an output terminal of the third shift register to output the received clock signal according to the potential at the pull-up node.

5. The Gate Driver on Array circuit according to claim 4, wherein the third shift register comprises:
   a reset sub-circuit, configured to receive a reset signal via a reset terminal of the third shift register, and reset potentials at the pull-up node and the output terminal of the third shift register according to the received reset signal.

6. The Gate Driver on Array circuit according to claim 1, wherein an input terminal of the second shift register is connected to the output terminal of the first shift register, and an input terminal of the third shift register is connected to an output terminal of the second shift register.

7. The Gate Driver on Array circuit according to claim 1, wherein the number of the at least one group of shift registers is half of the number of external clock signals received by the Gate Driver on Array circuit.

8. A display device, comprising the Gate Driver on Array circuit according to claim 1.

9. A method for driving the Gate Driver on Array circuit according to claim 1, wherein for the first shift register, the method comprises:
   providing an input signal to an input terminal of the first shift register, so that a potential at a pull-up node inside the first shift register becomes an operating potential;

after the input signal is supplied to the first shift register, outputting a gate driving signal at an output terminal of the first shift register, meanwhile providing the outputted gate driving signal as an initializing signal to an initializing terminal of the third shift register, so as to reset a potential at a pull-up node inside the third shift register; and after the gate driving signal is outputted from the first shift register, providing a gate driving signal outputted by the second shift register to a reset terminal of the first shift register, so as to reset a potential at the pull-up node inside the first shift register and a potential at the output terminal of the first shift register.

10. A Gate Driver on Array circuit, comprising:

at least one group of shift registers, each group of shift registers including a plurality of shift registers in cascade, the plurality of shift registers including a first shift register, a second shift register connected after the first shift register, and a third shift register connected after the second shift register, wherein the third shift register is provided with an initializing terminal which is connected to an output terminal of the fire shift register, wherein the third shift register comprises an initializing sub-circuit configured to receive an initializing signal via the initializing terminal of the third shift register, and reset a potential at a pull-up node inside the third shift register according to the received initializing signal, wherein the initializing sub-circuit comprises:

a first transistor, a gate of the first transistor being connected to the initializing terminal of the third shift register, a source of the first transistor being connected to the pull-up node, and a potential at a drain of the first transistor being set to a reset potential; wherein the initializing sub-circuit further comprises:

a second transistor, a gate of the second transistor being connected to the drain of the first transistor, a source of the second transistor being connected to an output terminal of the third shift register, and a potential at a drain of the second transistor being set to a reset potential; or a second transistor, a gate of the second transistor being connected to the initializing terminal of the third shift register, a source of the second transistor being connected to an output terminal of the third shift register, and a potential at a drain of the second transistor being set to a reset potential.

11. A Gate Driver on Array circuit, comprising at least one group of shift registers, each group of shift registers including a plurality of shift registers in cascade, the plurality of shift registers including a first shift register, a second shift register connected after the first shift register, and a third shift register connected after the second shift register, wherein the third shift register is provided with an initializing terminal which is connected to an output terminal of the first shift register, wherein the third shift register comprises an initializing sub-circuit configured to receive an initializing signal via the initializing terminal of the third shift register, and reset a potential at a pull-up node inside the third shift register according to the received initializing signal, wherein the initializing sub-circuit comprising a first transistor and a second transistor, a source and a gate of the first transistor being connected, together and connected to the initializing terminal of, the third shift, register, and a drain of the first transistor being connected to a reset terminal of the third shift register; a gate of the second transistor being connected to the initializing terminal of the third shift register, a source of the second transistor being connected to an output terminal of the third shift register, and a potential at a drain of the second transistor being set to a reset potential.

* * * * *